United States Patent
Chen et al.

(10) Patent No.: US 9,105,613 B1
(45) Date of Patent: Aug. 11, 2015

(54) METHOD OF MANUFACTURING ELECTRONIC PACKAGE MODULE AND ELECTRONIC PACKAGE MODULE MANUFACTURED BY THE SAME

(71) Applicant: ADVANCED SEMICONDUCTOR ENGINEERING INC., Kaohsiung (TW)

(72) Inventors: Jenchun Chen, Kaohsiung (TW); Shih-Chien Chen, Kaohsiung (TW); Pai-Sheng Cheng, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 14/459,367

(22) Filed: Aug. 14, 2014

(30) Foreign Application Priority Data

Jul. 30, 2014 (TW) .............................. 103126030 A

(51) Int. Cl.
*H01L 23/495* (2006.01)
*H01L 21/48* (2006.01)

(52) U.S. Cl.
CPC ........ *H01L 21/48* (2013.01); *H01L 2224/48091* (2013.01); *H01L 2224/48247* (2013.01)

(58) Field of Classification Search
CPC ............ H01L 2224/48091; H01L 2224/48247
USPC ................... 257/666, 667, 678; 438/111, 123
See application file for complete search history.

(56) References Cited

U.S. PATENT DOCUMENTS

2010/0199777 A1* 8/2010 Hooper et al. .................. 73/721
2014/0104133 A1* 4/2014 Finn et al. ..................... 343/866

* cited by examiner

*Primary Examiner* — Jami M Valentine
(74) *Attorney, Agent, or Firm* — Foley & Lardner LLP; Cliff Z. Liu; Angela D. Murch

(57) ABSTRACT

A method of manufacturing an electronic package module is provided. The method forms dual-side and selective encapsulation by using a dam filling process and a sacrificial layer. Electronic components are protected from electromagnetic interference while not interfering functioning of specific electronic components which are not encapsulated.

14 Claims, 6 Drawing Sheets

METHOD OF MANUFACTURING ELECTRONIC PACKAGE MODULE AND ELECTRONIC PACKAGE MODULE MANUFACTURED BY THE SAME

BACKGROUND OF THE INVENTION

1. Field of the Invention

The present disclosure relates to a method of manufacturing an electronic package module; in particular, to a method of forming selective encapsulation by using a dam and filling process. Another aspect of the present disclosure relates to an electronic package module manufactured by the same.

2. Description of Related Art

A conventional electronic package module includes a circuit board and a plurality of electronic components mounted on the circuit board. The electronic components are for example chip packages, passive components, etc. Additionally, most electronic package modules include molding compounds for encapsulating the electronic components.

However, encapsulation interferes with the operation of and is therefore not appropriate for some electronic components such as optical components (e.g. CMOS image sensors (CIS), charge-coupled devices (CCD), light emitting diodes (LED), etc.) and connectors.

SUMMARY OF THE INVENTION

The object of the present disclosure is to provide a method of manufacturing an electronic package module for forming dual-side encapsulation by using a dam and filling process and a sacrificial layer.

An embodiment of the present disclosure comprises the steps: providing a circuit board having a first mounting face and a second mounting face, wherein the first mounting face includes a first encapsulation region and a first predetermined region, and the second mounting face has a second encapsulation region and a second predetermined region; mounting at least one first-type electronic component onto the first mounting face at the first encapsulation region; forming a first dam structure at the border between the first encapsulation region and the first predetermined region; forming a first encapsulation at the first encapsulation region; forming a second dam structure at the border between the second encapsulation region and the second predetermined region; forming a second encapsulation at the second encapsulation region; forming a first metal shield layer on the first encapsulation region and contacting at least one contact pad on the circuit board; forming a first sacrificial layer on the first metal shield layer; forming a second metal shield layer on the second encapsulation region and contacting the circuit board; and removing the first sacrificial layer.

By using a dam and filling process to form molding compound and metal coating at regions to be encapsulated, the abovementioned method of manufacturing an electronic package module according to the present disclosure can selectively encapsulate without affecting operation of particular components and further provide metal shield protecting against electromagnetic interference.

Additionally, the present disclosure provides an electronic package module including a circuit board, a first encapsulation, a second encapsulation, a first dam structure, a second dam structure, a first metal shield layer, and a second metal shield layer. The first dam structure and the second dam structure are made of photo-curable metal glue. The circuit board includes a first mounting face and a second mounting face. The first mounting face has at least one encapsulation region and at least one predetermined region. The second mounting face has at least one second encapsulation region and at least one second predetermined region. The first encapsulation is disposed above the first encapsulation region and covers at least one electronic component. The second encapsulation is disposed above the second encapsulation region and covers at least one electronic component. At least one side of the first encapsulation is adjacent to the first dam structure. At least one side of the second encapsulation is adjacent to the second dam structure. The first metal shield layer covers the upper surface of the first encapsulation and the first dam structure and is electrically connected to at least one contact pad on the circuit board. The second metal shield layer covers the upper surface of the second encapsulation and the second dam structure and is electrically connected to at least one contact pad on the circuit board.

In order to further the understanding regarding the present disclosure, the following embodiments are provided along with illustrations to facilitate the disclosure of the present disclosure.

DETAILED DESCRIPTION OF THE PREFERRED EMBODIMENTS

The following embodiments are used to describe a method of manufacturing electronic package modules according to the present disclosure. The present disclosure is not limited to the particular environment, application or special implementations described in the embodiments. Therefore, the embodiments are not meant to limit the present disclosure.

Additionally, the first-type electronic components refer to IC chip, chip packages, discrete components or passive components which can operate normally after being encapsulated. The second-type electronic components refer to connector units or optical components such as CMOS image sensors, CCD or LEDs, which cannot operate normally after being encapsulated.

Figure 1A:
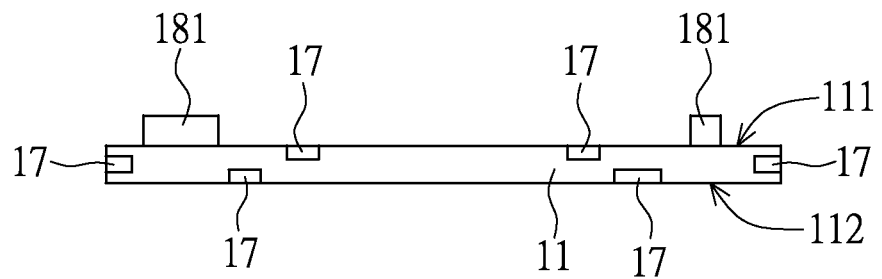
FIG. 1A-1L shows a sequential process of a method of manufacturing an electronic package module according to a first embodiment of the present disclosure.

FIG. 1A to FIG. 1L shows schematic diagrams of processes of a method of manufacturing an electronic package module according to a first embodiment of the present disclosure. In the present embodiment, first a circuit board 11 is prepared as shown in FIG. 1A. The circuit board 11 has a first mounting face 111 and a second mounting face 112 at different sides. The first and second mounting faces do not refer to any order regarding front and rear, upper and lower, or front and back. The first mounting face 111 includes a first encapsulation region and a first predetermined region (not labelled in the figures). The second mounting face 112 includes a second encapsulation region and a second predetermined region (not labelled in the figures). In the present embodiment, the first encapsulation region is positioned at the periphery of the first mounting face and the first predetermined region is positioned at the center of the first mounting face. The second encapsulation region and the second predetermined region are positioned at the second mounting face 112. However, the present disclosure is not limited thereto. The quantity, shape, position and dimension of the encapsulation region or predetermined region can be designed according to the need. Additionally, the circuit board 11 has at least one contact pad 17 made of electrically conductive material for grounding. The contact pad 17 is positioned on the circuit board 11 or embedded in the circuit board 11, and is exposed at the first mounting face 111, the second mounting face 112, or the side of the circuit board 11. Next, as shown in FIG. 1A, the first-type electronic components 181 are mounted on the circuit board 11 at the first encapsulation region.

Figure 1B:
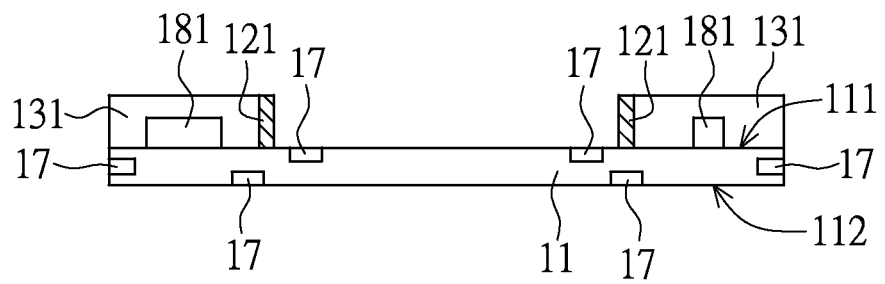

Next, as shown in FIG. 1B, a first dam 121 is formed at the boundary between the first encapsulation and the first predetermined region of the circuit board 11. The first dam 121 can be made of photoreactive polymer, which can be cured by light as it is being coated to form a dam structure of a particular height, but is not limited thereto as long as a dam structure of a particular height can be formed at the boundary between the first encapsulation region and the first predetermined region. In the present embodiment, the first dam 121 and the contact pad 17 do not overlap. In other words, after the first dam 121 has been formed, the contact pads 17 are still exposed at the first mounting face 111, the second mounting face 112 or the side of the circuit board 11, for increasing the contact area between subsequently formed metal shield layers and the contact pads 17. Then, using the first dam 121 as a barrier, a first encapsulation 131 is formed on the circuit board 11 at the first encapsulation region and covers the first-type electronic component 181. After the first encapsulation 131 has been cured, the surface thereof is polished and the selective encapsulation of the first-type electronic component 181 is completed. At this moment, the first encapsulation 131 has at least one side wall adjacent to the first dam 121.

Figure 1C:
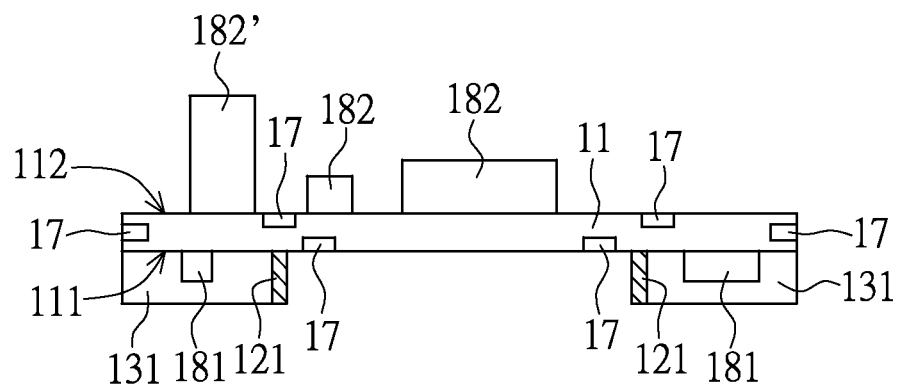

Referring to FIG. 1C, as mentioned above, the second mounting face 112 of the circuit 11 is likewise partitioned into an encapsulation region and a predetermined region (not labelled), such as a second encapsulation region and a second predetermined region. The second encapsulation region and the second predetermined region are respectively positioned at different sides of the circuit board 11. As shown in FIG. 1C, the first-type electronic components 182, 182' are mounted on the second mounting face 112 of the circuit board 11 at the second encapsulation region.

Figure 1D:
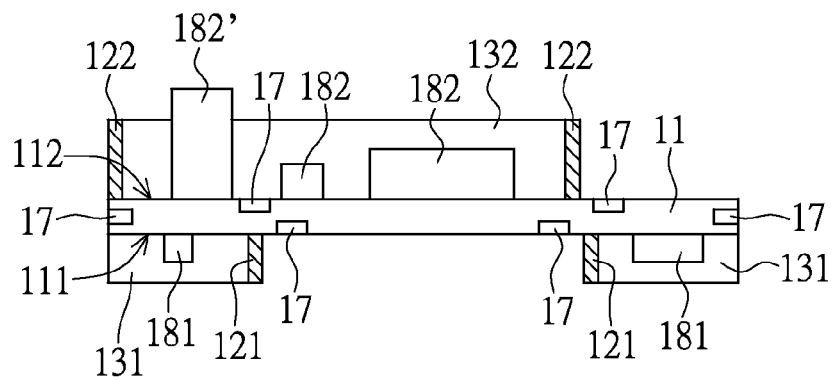

Next, referring to FIG. 1D, a second dam 122 is formed at the boundary between the second encapsulation region and the second predetermined region of the circuit board 11. Similarly, the second dam 122 can be made of photoreactive polymer, which can be cured by light as it is being coated to form a dam structure of a particular height, but is not limited thereto as long as a dam structure of a particular height can be quickly formed at the boundary between the second encapsulation region and the second predetermined region. In the present embodiment, the second dam 122 and the contact pad 17 do not overlap, for increasing the contact area between subsequently formed metal shield layers and the contact pads 17. Then, using the second dam 122 as a barrier, a second encapsulation 132 is formed on the circuit board 11 at the second encapsulation region and covers the first-type electronic component 182, 182'. After the second encapsulation 132 has been cured, the surface thereof is polished and the selective encapsulation of the first-type electronic component 182, 182' is completed. At this moment, the second encapsulation 132 has at least one side wall adjacent to the second dam 122. Of particular note, at least one surface of the first-type electronic component 182' is exposed at the second encapsulation 132. For example, as shown in FIG. 1D, the height of the first-type electronic component 182' (namely the distance between the upper surface of the first-type electronic component 182' and the second mounting face 112) is greater than the height of the second encapsulation 132, and the second encapsulation 132 partially covers the first-type electronic component 182'.

Figure 1E:
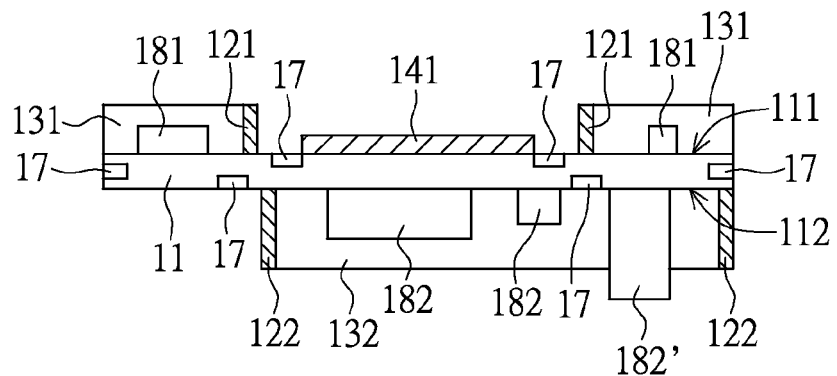
Figure 1F:
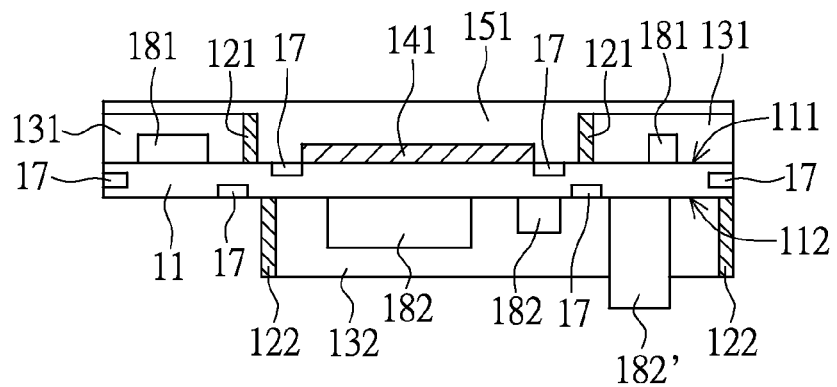
Figure 1G:
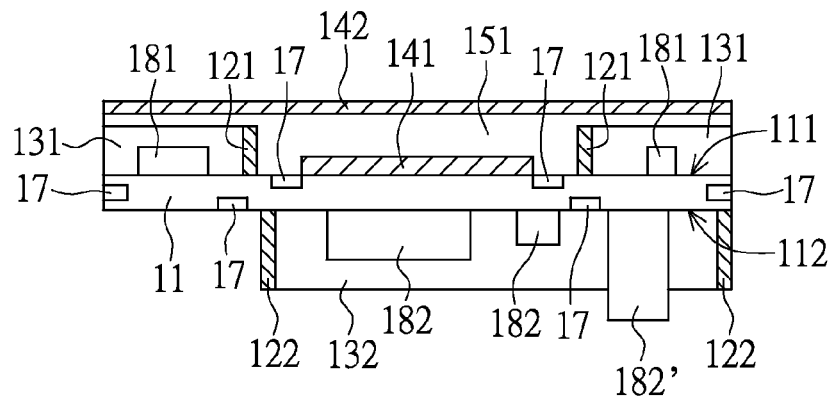

Next, in order to build a metal shield layer protecting against electromagnetic interference on the first encapsulation region of the circuit board 11, a second sacrificial layer 141 is coated on the first predetermined region of the circuit board 11. The second sacrificial layer 141 does not cover the contact pad 17 such as the ground pad, as shown in FIG. 1E. Then, as shown in FIG. 1F, a first metal shield layer 151 is coated on the entire surface and contacts the circuit board 11. Of particular note, the contact pad 17 exposed at the first mounting face 111 and not covered by the second sacrificial layer 141 directly contacts the first metal shield layer 151 to achieve electrical connection. Next, as shown in FIG. 1G, in order to carry out a dual-side encapsulation, a first sacrificial layer 142 is formed at the entire surface of the first metal shield layer 151.

The method of manufacturing an electronic package module according to the present embodiment can use laser to form compartments, forming metal shield compartments for particular first-type electronic components. The following description uses the first-type electronic components 182, 182' on the second mounting face 112 as examples, but does not limit the present disclosure thereto.

Figure 1H:
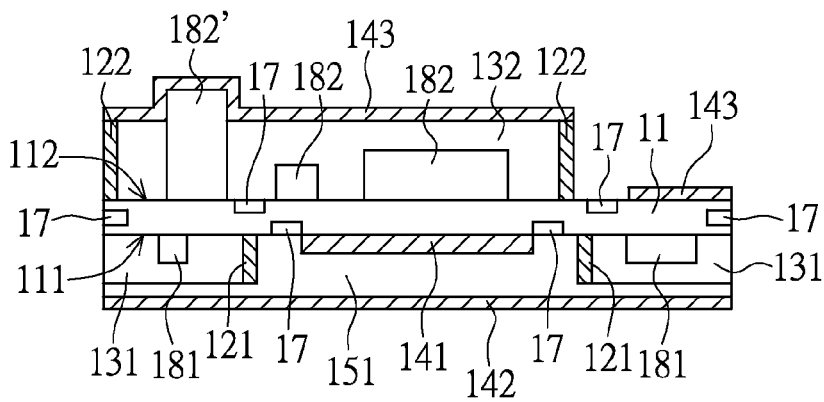

Referring to FIG. 1H, after forming the second encapsulation 132 on the circuit board 11 at the second encapsulation region by using the second dam 122, and polishing the surface of the second encapsulation 132, a third sacrificial layer 143 is formed on the second predetermined region and the second encapsulation region of the circuit board, for protecting the surface. The third sacrificial layer 143 on the second predetermined region covers the second encapsulation 132 and the first-type electronic component 182'. Of particular note, the contact pad 17 exposed at the second mounting face 112 is not covered by the third sacrificial layer 143. Therefore, a metal shield layer subsequently formed can contact the contact pad 17 and achieve electrical connection thereto.

Figure 1I:
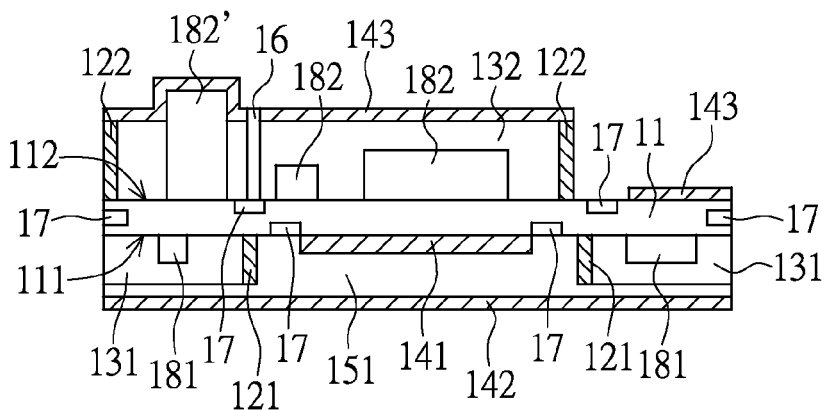

Next, referring to FIG. 1I, in order to form individual metal shield compartments for specific first-type electronic components 182, 182', laser can be used at necessary locations to drill grooves on the second encapsulation 132, until the contact pad 17 on the circuit board 11 is exposed. The difference in absorption of laser between the contact pad 17 and the second encapsulation 132 can be used to mark the end of the laser cutting at the circuit board 11, but the present disclosure is not limited thereto and can use other methods, such as routing, to drill the encapsulation 132 while preserving the circuit board 11.

After the groove has been drilled, metal glue 16 is filled in the groove and cured, as shown in FIG. 1I, thereby achieving individual metal shield compartments for the first-type electronic components 182, 182'. Subsequently forming a metal shield layer can strengthen the protection against electromagnetic interference. The metal glue 16 can be a conventional metal glue, preferably a metal glue which can be cured by heat, but is not limited thereto as long as it can be filled in a narrow groove and can be completely cured.

Figure 1J:
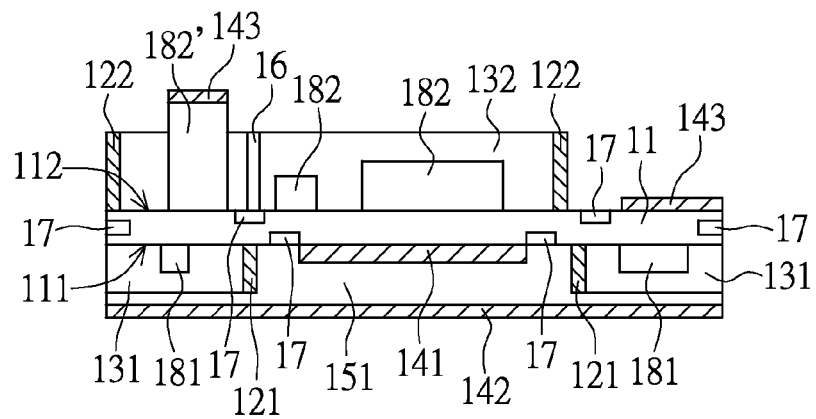

Next, referring to FIG. 1J, a portion of the third sacrificial layer 143 on the second encapsulation region is removed, such that the third sacrificial layer 143 only covers the first-type electronic component 182' and the second predetermined region.

Figure 1K:
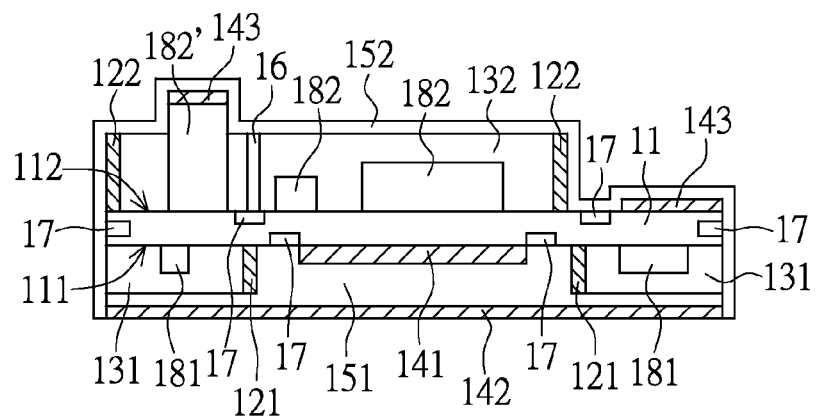
Figure 1L:
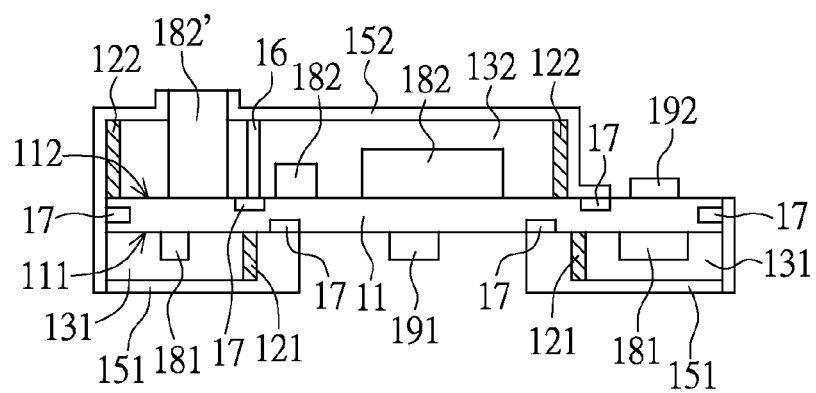

Referring to FIG. 1K, a second metal shield layer 152 is coated on the entire exterior such that the second metal shield layer 152 covers the exterior of the electronic package module and contacts the circuit board 11. For example, the second metal shield layer 152 can completely cover the lateral of the circuit board 11, and contact the contact pads 17 on the lateral sides of the circuit board and the contact pads 17 exposed at the second mounting face 112, achieving electrical connection thereto. Subsequently the first sacrificial layer 142, the second sacrificial layer 141, and the third sacrificial layer 143 are removed. As such, metal shield layers are selectively formed on the two faces of the circuit board 11 (the first mounting face 111 and the second mounting face 112) as shown in FIG. 1L.

Lastly, a second-type electronic component 191 can be mounted on the first mounting face 111 at the first predetermined region, and a second-type electronic component 192 can be mounted on the second mounting face 112 at the second predetermined region. The second-type electronic components 191, 192 can be optical components, sensors or connectors.

In the present embodiment, the first-type electronic components 181, 182, 182 and the second-type electronic components 191, 192 are mounted on the circuit board 11 for example by surface mount technology (SMT). The types, location and quantities of the first-type electronic components 181, 182, 182' and the second-type electronic components 191, 192 can be designed according to the need. Moreover, the first encapsulation 131 and the second encapsulation 132 can be formed for example by resin transfer molding or by injection molding, but is not limited thereto. Additionally, the first metal shield layer 151 and the second metal shield layer 152 can be formed by spray coating, electroless plating, sputtering, etc. Additionally, the sacrificial layers 141, 142, 143 can be ink that compose of photosensitive medium or thermoplastic resin, such as liquid photosensitive ink, but is not limited thereto. The sacrificial layers 141, 142, 143 are used to remove the contamination produced by process and to protect the surface under the sacrificial layers 141, 142, 143. Organic solvents can be used to remove the sacrificial layers 141, 142, 143, but is not limited thereto.

In an embodiment of the present disclosure, the first dam 121 and the second dam 122 can be conductive or not conductive. In the condition that the first dam 121 and the second 122 are both conductive and formed by curing a photo-curable metal glue which is composed of conductive medium, the first dam 121 and the second dam 122 directly contact the contact pads 17 on the circuit board 11. Furthermore, the first metal shield layer 151 electrically connect to the first dam 121 and the second metal shield layer 152 electrically connect to the second dam 122. Therefore, the first metal shield layer 151 and the second metal shield layer 152 can be electrically connected to the contact pads 17, such as ground pads, through the first dam 121 and the second dam 122.

Moreover, as shown in FIG. 1E, FIG. 1F and FIG. 1G, regarding the protrusion of the first-type electronic component 182' over the second encapsulation 132, the present embodiment uses a carrier having an indentation whose shape and dimension fits the shape and dimension the first-type electronic component 182' for accommodating the protruding portion of the first-type electronic component 182'.

In another embodiment of the present disclosure, the first mounting face 111 can have a plurality of first encapsulation regions. According to design, at least one of these first encapsulation regions can be formed with a first encapsulation 131 by using a first dam 121. Alternately, the second mounting face 112 can have a plurality of second encapsulation regions. According to design, at least one of these second encapsulation regions can be formed with a second encapsulation 132 by using a second dam 122.

Figure 2A:
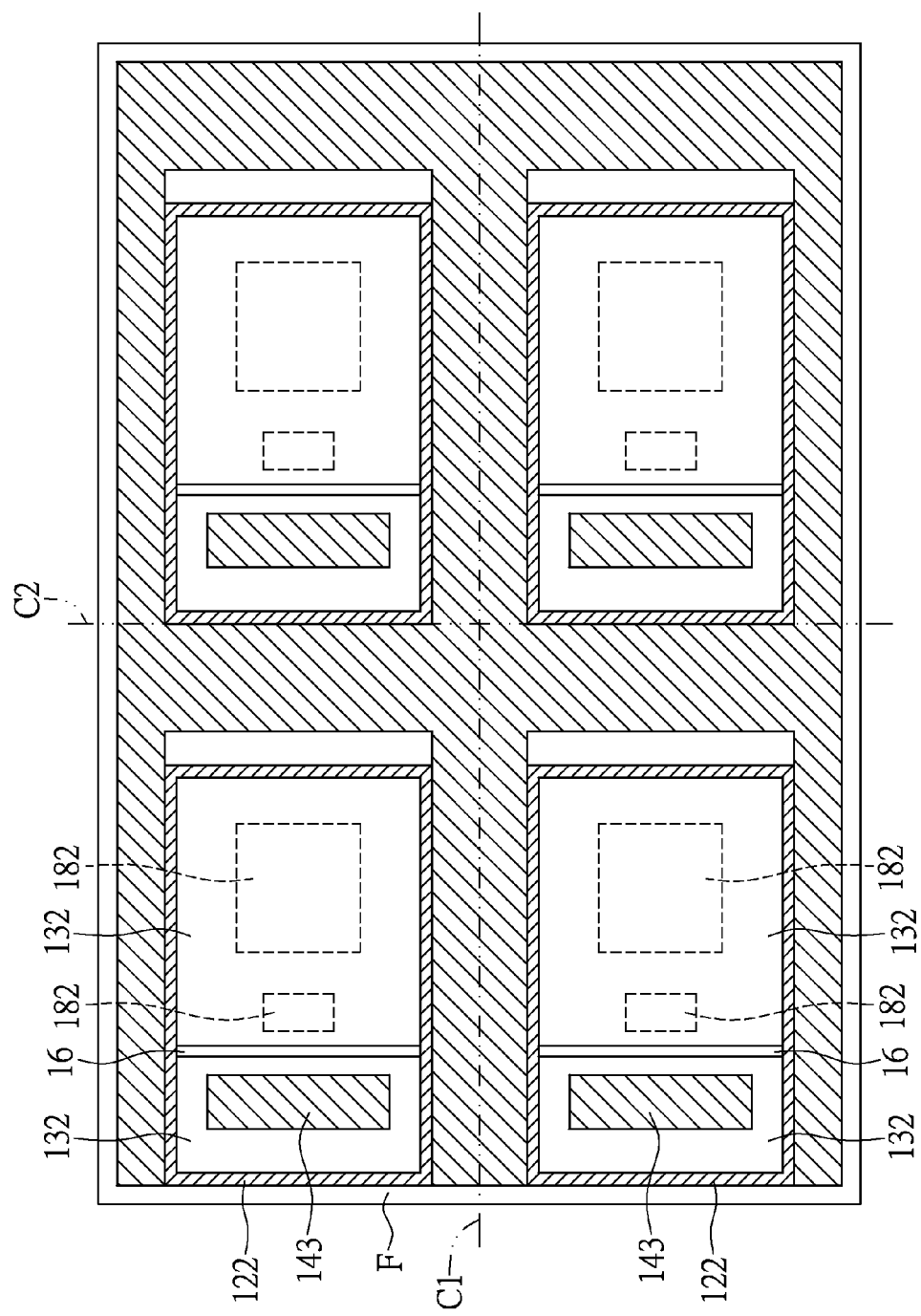
FIG. 2A shows a top view of a step of a method of manufacturing a plurality of electronic package modules according to the present disclosure.
Figure 2B:
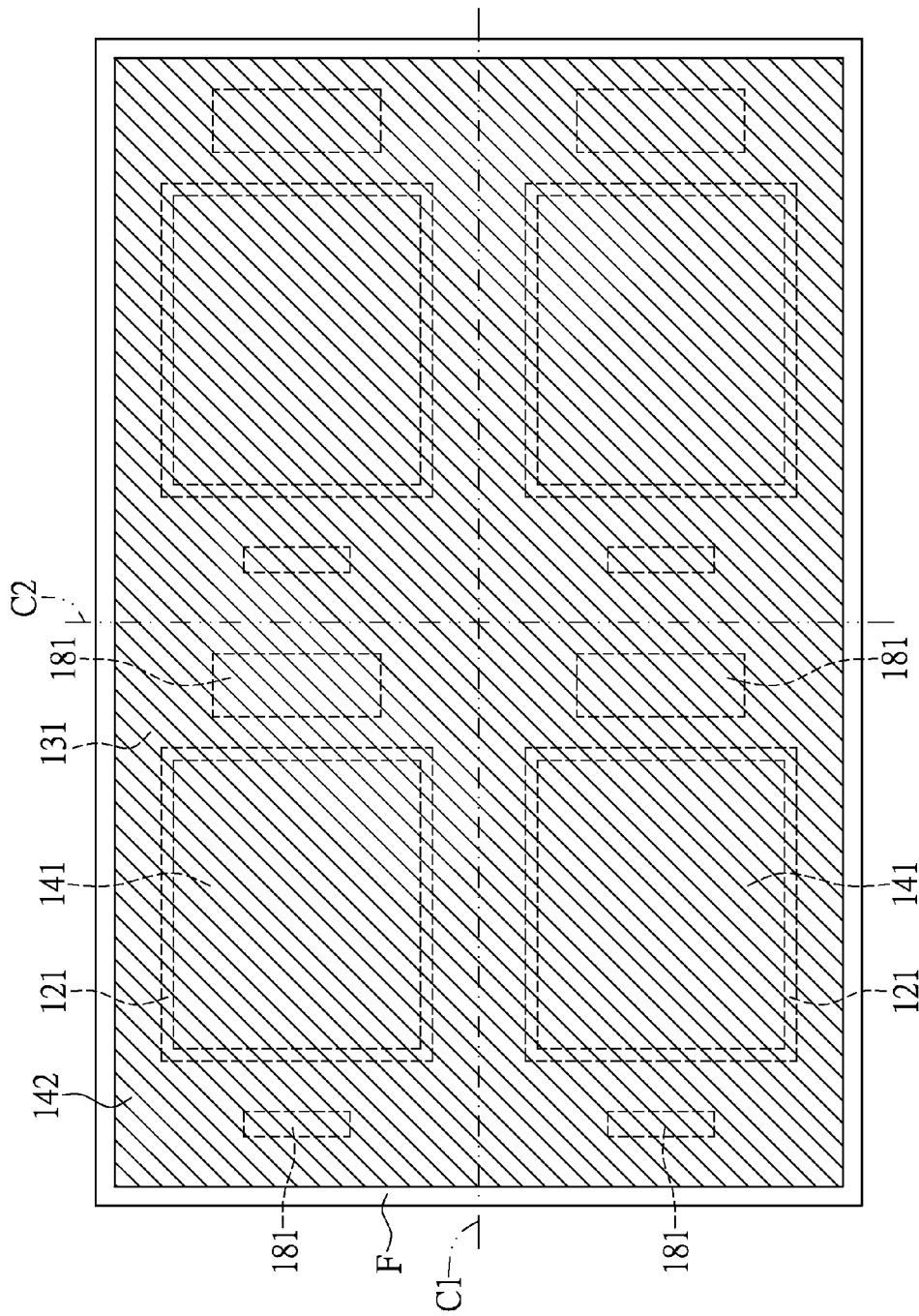
FIG. 2B shows a bottom view of a step of a method of manufacturing a plurality of electronic package modules according to the present disclosure.

FIG. 2A shows a top view of a step of a method of manufacturing a plurality of electronic package modules according to the present disclosure. FIG. 2B shows a bottom view of a step of a method of manufacturing a plurality of electronic package modules according to the present disclosure. Through method of manufacturing an electronic package module mentioned in the above embodiments, a plurality of electronic package modules can be completed at the same time. FIG. 1A to FIG. 1L can represent one of the electronic package modules shown in FIG. 2A and FIG. 2B. FIG. 2A and FIG. 2B are respectively a top view and a bottom view corresponding to FIG. 1J.

The method of the present embodiment carries out multiple electronic package modules at the same time. In steps shown in FIG. 1B and FIG. 1D, a frame F can be used as a barrier to form the first encapsulation 131 and the second encapsulation 132 at the first encapsulation region and the second encapsulation region of the circuit board 11. The frame F is temporarily fixed at the border of the circuit board and surrounds the sides of the circuit board.

After completing the step shown in FIG. 1J, a cutting machine or laser cutter is used to cut the circuit board to obtain individual modules, such that ground traces are exposed at the sides of the module boards. Namely, the cut lines C1, C2 are cut. Afterward, in the steps shown in FIG. 1K to FIG. 1L, the second metal shield layer 152 is coated on the entire surface of the electronic package modules to obtain a plurality of electronic package modules having complete metal shields.

Referring to FIG. 1L, the second-type electronic components 191, 192 can be respectively mounted on the predetermined regions of the first mounting face 111 and the second mounting face 112 of the circuit board. Both faces of the circuit board are partially formed with encapsulations, and the electronic components not suitable to be encapsulated are placed at the predetermined regions. Protection against electromagnetic interference, shield compartments and not covering the second-type electronic components with encapsulations are achieved.

While the invention has been disclosed with respect to a limited number of embodiments, numerous modifications and variations will be appreciated by those skilled in the art. It is intended, therefore, that the following claims cover all such modifications and variations that may fall within the true spirit and scope of the invention.

What is claimed is:

1. A method of manufacturing an electronic package module, the method comprising:
   providing a circuit board having a first mounting face and a second mounting face, wherein the first mounting face has at least one first encapsulation region and at least one first predetermined region, and the second mounting face has at least one second encapsulation region and at least one second predetermined region;
   mounting at least one first-type electronic component on the first mounting face at the first encapsulation region;
   forming a first dam structure at the boundary between the first encapsulation region and the first predetermined region;
   forming a first encapsulation at the first encapsulation region;
   forming a second dam structure at the boundary between the second encapsulation region and the second predetermined region;

forming a second encapsulation at the second encapsulation region;

forming a first metal shield layer at the first encapsulation region, wherein the first metal shield layer contacts at least one contact pad on the circuit board;

forming a first sacrificial layer on the first metal shield layer;

forming a second metal shield layer at the second encapsulation region, wherein the second metal shield layer contacts the circuit board; and removing the first sacrificial layer.

2. The method of manufacturing an electronic package module according to claim 1, wherein after forming the first encapsulation and before forming the second dam structure, the method further comprises:

mounting at least one first-type electronic component on the second mounting face at the second encapsulation region.

3. The method of manufacturing an electronic package module according to claim 2, wherein before forming the first metal shield layer, the method further comprises: forming a second sacrificial layer at the first predetermined region, and after forming the first metal shield layer, the step of removing the second sacrificial layer is included.

4. The method of manufacturing an electronic package module according to claim 1, wherein before forming the second metal shield layer, the method further comprises: forming a third sacrificial layer at the second predetermined region, wherein the second metal shield layer covers the outer surface of the electronic package module, and after forming the second metal shield layer, the step of removing the third sacrificial layer is included.

5. The method of manufacturing an electronic package module according to claim 4, wherein before forming the first metal shield layer, the method further comprises:

drilling the first encapsulation up to the first mounting face to form at least one first groove; and filling the first groove with a metal glue and curing the metal glue.

6. The method of manufacturing an electronic package module according to claim 5, wherein the method of drilling comprises laser or routing.

7. The method of manufacturing an electronic package module according to claim 4, wherein before forming the second metal shield layer, the method further comprises:

drilling the second encapsulation up to the second mounting face to form at least one second groove; and filling the second groove with a metal glue and curing the metal glue.

8. The method of manufacturing an electronic module according to claim 7, wherein the method of drilling comprises laser or routing.

9. The method of manufacturing an electronic package module according to claim 7, further comprising: forming a portion of the third sacrificial layer at the surface of the second encapsulation before drilling the second encapsulation, and removing the portion of the third sacrificial layer covering the surface of the second encapsulation after the step of drilling the second encapsulation.

10. The method of manufacturing an electronic package module according to claim 1, further comprising:

mounting at least one second-type electronic component on the first mounting face at the first predetermined region; and mounting at least one second-type electronic component on the second mounting face at the second predetermined region; wherein the second-type electronic component is an optical component, a sensor or a connector.

11. The method of manufacturing an electronic package module according to claim 1, wherein the first dam structure and the second dam structure are formed by photocuring a photo-curable metal glue.

12. An electronic package module comprising:

a circuit board having a first mounting face and a second mounting face, wherein the first mounting face has at least one first encapsulation region and at least one first predetermined region, and the second mounting face has at least one second encapsulation region and at least one second predetermined region; wherein the first encapsulation region has a first encapsulation thereon, and the first encapsulation covers at least one electronic component;

the second encapsulation region has a second encapsulation thereon, and the second encapsulation covers at least one electronic component;

the first encapsulation has at least one lateral wall contacting a first dam structure;

the second encapsulation has at least one lateral wall contacting a second dam structure;

a first metal shield layer covers the upper surface of the first encapsulation and the first dam structure, and is electrically connected to at least one contact pad on the circuit board; and a second metal shield layer covers the upper surface of the second encapsulation and the second dam structure, and is electrically connected to at least one contact pad on the circuit board, and the first dam structure and the second dam structure are made of photo-curable metal glue.

13. The electronic package module according to claim 12, wherein the first encapsulation and the second encapsulation has at least one conductive structure electrically connected to the respective first metal shield layer and at least one contact pad on the circuit board, or electrically connected to the respective second metal shield layer and at least one contact pad on the circuit board.

14. The electronic package module according to claim 13, wherein the first predetermined region and the second predetermined region has at least one optical component, one sensor or one connector disposed thereat.

* * * * *